United States Patent [19]

Ghadaksaz

[11] Patent Number: 5,065,121
[45] Date of Patent: Nov. 12, 1991

[54] SWITCHABLE RESONATOR DEVICE

[75] Inventor: Masood Ghadaksaz, Cherry Hill, N.J.

[73] Assignee: RF Products, Inc., Camden, N.J.

[21] Appl. No.: 174,721

[22] Filed: Mar. 29, 1988

[51] Int. Cl.$^5$ .............................................. H01P 7/00
[52] U.S. Cl. .................................. 333/235; 333/174; 333/205; 334/55; 334/56
[58] Field of Search ............... 333/174, 205, 235, 246, 333/262; 334/41, 55, 56

[56] References Cited

U.S. PATENT DOCUMENTS

| | | | |
|---|---|---|---|
| 3,245,014 | 4/1966 | Plutchok et al. | 333/262 |
| 3,289,123 | 11/1966 | Bomhardt et al. | 334/19 |
| 3,414,833 | 12/1968 | Tolliver | 334/41 X |
| 4,186,360 | 1/1980 | Ohashi | 334/55 |
| 4,467,296 | 8/1984 | Cohen et al. | 333/202 |
| 4,468,644 | 8/1984 | Teague et al. | 333/205 |
| 4,472,695 | 9/1984 | Beauquet et al. | 333/235 X |
| 4,568,895 | 2/1986 | Reed | 333/203 |
| 4,577,170 | 3/1986 | Hayashi | 333/205 |
| 4,622,528 | 11/1986 | Millard | 333/205 |
| 4,623,856 | 11/1986 | Bickley et al. | 333/205 |
| 4,692,724 | 9/1987 | Harris | 333/235 X |

FOREIGN PATENT DOCUMENTS

| | | | |
|---|---|---|---|
| 2548846 | 1/1985 | France | 333/202 |
| 401020 | 8/1942 | Italy | 334/56 |

Primary Examiner—Bernarr E. Gregory
Attorney, Agent, or Firm—Jacob Trachtman

[57] ABSTRACT

A switchable resonator device having a selectable center frequency over a wide radio frequency range comprising a radio frequency signal input and output means, a resonator structure connected between the signal input and output means for respectively receiving and delivering radio frequency input and output signals, the resonator structure using a strip line conductor having a first conductor element with first and second extending portions each providing respective inductance properties, a first switchable means for controllably connecting the first portion of the first conductor element at selected locations along its extension with the second element for varying its inductive properties, a second switchable means for controllably providing a selected capacitance between the second portion of the first conductor element and the second conductor element, and control means providing a control signal to the first and second switchable means for selecting and changing the center frequency of the resonator device at a rapid rate.

22 Claims, 4 Drawing Sheets

FIG. 7
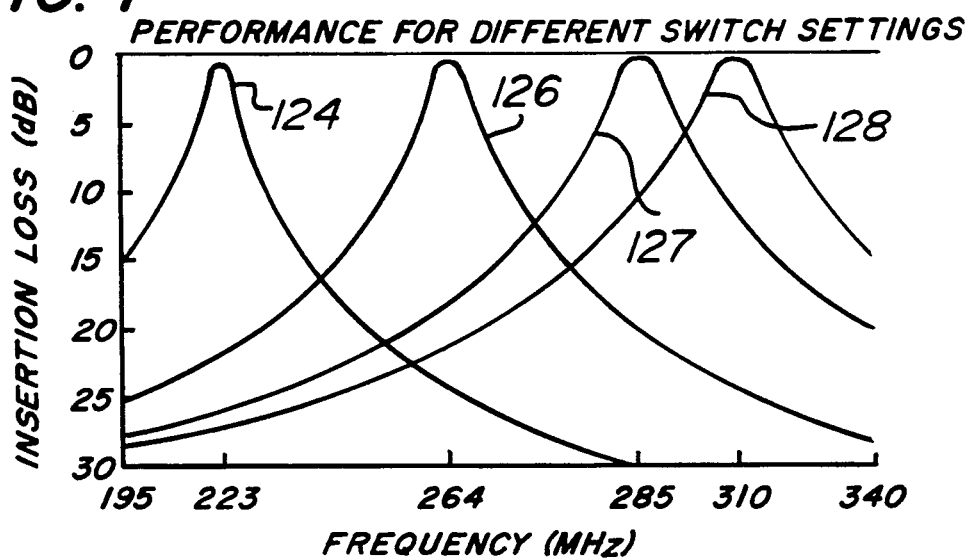
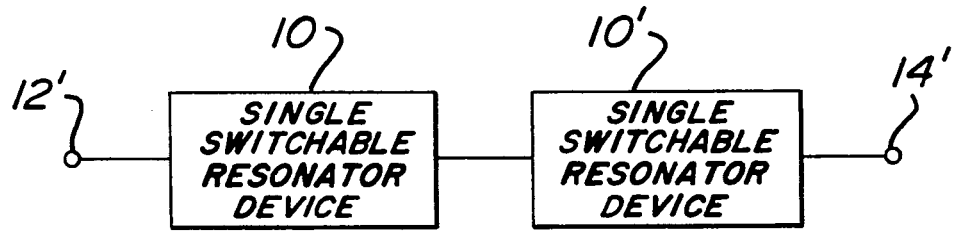
FIG. 8
FIG. 9
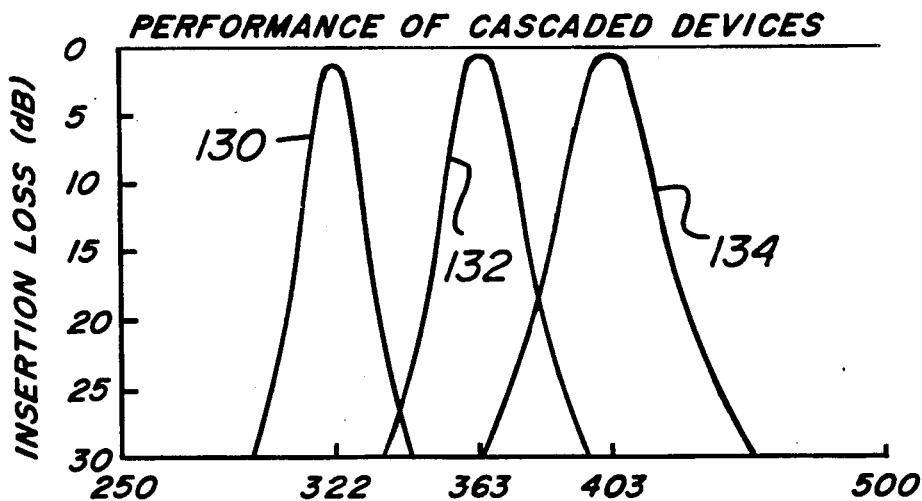

SWITCHABLE RESONATOR DEVICE

BACKGROUND OF INVENTION

The invention relates to a switchable resonator device, and more particularly to a switchable resonator device which has a center frequency which is selectable over a wide radio frequency range and may be changed rapidly.

SUMMARY OF THE INVENTION

Heretofore, electronically tuned resonators have been disclosed which have been of the switching variety allowing rapid switching to different center frequencies as described in U.S. Pat. No. 4,623,856. It has, however, been desirable to provide such devices with very narrowband filter characteristics while allowing a high rate of change of the center frequency on the order of 7,000 changes per second with a transition time of 5 micro seconds and over a wide radio frequency range such as 100 MHz to 500 MHz. In addition to achieving such a high rate of frequency change or "hopping" rate, it is also desirable to be able to provide high stability and repeatability by use of electronic control signals and to allow simple coupling between a plurality of switching resonator devices to improve its narrow band characteristic and operating properties.

It is therefore a principal object of the invention to provide a new and improved switchable resonator device which has a center frequency which is electronically selectable over a wide frequency range.

Another object of the invention is to provide a new and improved switchable resonator device which may have its center frequency switched at a high rate over a wide radio frequency range.

Another object of the invention is to provide a new and improved switchable resonator device which may be electronically controlled to provide accurate switching of its center frequency with great repeatability and with a short transition time between changes.

Another object of the invention is to provide a new and improved switchable resonator device having a high selectivity and filter characteristic for the selected center frequency which provides a narrow pass-band.

Another object of the invention is to provide a new and improved switching resonator device utilizing the lumped inductive properties of a strip line conductor for providing highly desirable electrical characteristics.

Another object of the invention is to provide a new and improved switchable resonator device, a plurality of which may be connected together for providing enhanced performance.

The foregoing and other objects of the invention will become more apparent as the following detailed description of the invention is read in conjunction with the drawing.

DESCRIPTION OF DRAWING

FIG. 7 is a graphic representation illustrating the band-pass characteristics of the switchable resonator device for various center frequencies over a frequency range of 195 to 340 MHz for switching to selected values for its variable inductance and variable capacitance of its circuit.

FIG. 8 illustrates the cascade connection of two switchable resonator devices, and FIG. 9 is a graphic representation illustrating the band-pass characteristics of the cascaded resonator devices shown in FIG. 8 over a frequency range of 250 to 500 MHz for several selected center frequencies.

DETAILED DESCRIPTION

Figure 1:
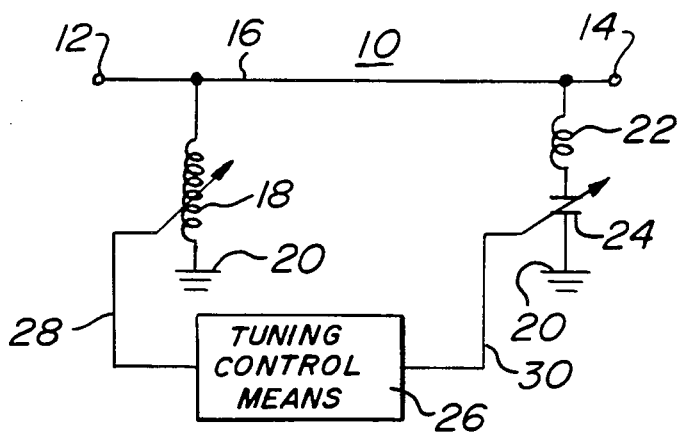
FIG. 1 is a simplified schematic drawing of the switchable resonator device embodying the invention.

Referring to the figures, FIG. 1 is a simplified schematic representation of the electrical configuration of the switchable resonator device 10 of the invention. The device 10 includes an input terminal 12 and an output terminal 14 for receiving and delivering radio frequency signals over a wide frequency range. The terminals 12 and 14 are connected by conductor 16. A variable inductor 18 is connected between the line 16 and ground 20, while a fixed inductor 22 has one end connected to the line 16 and the other end return to ground 20 through a variable capacitor 24. A tuning control means 26 provides output signals over lines 28 and 30 for changing or switching the inductance of the variable inductor 18 and the capacitance of the variable capacitor 24. The tuning control means 26 provides rapidly changing signals for causing the switching resonator device 10 to change the values of its variable components at a high rate. Thus, a radio frequency signal which is delivered to the input terminal 12 is subject to the filtering action of the resonator device for allowing the passage of an input signal to the output terminal 14 only within a selected narrow band having a center frequency controlled by the tuning control means 26.

Figure 3:
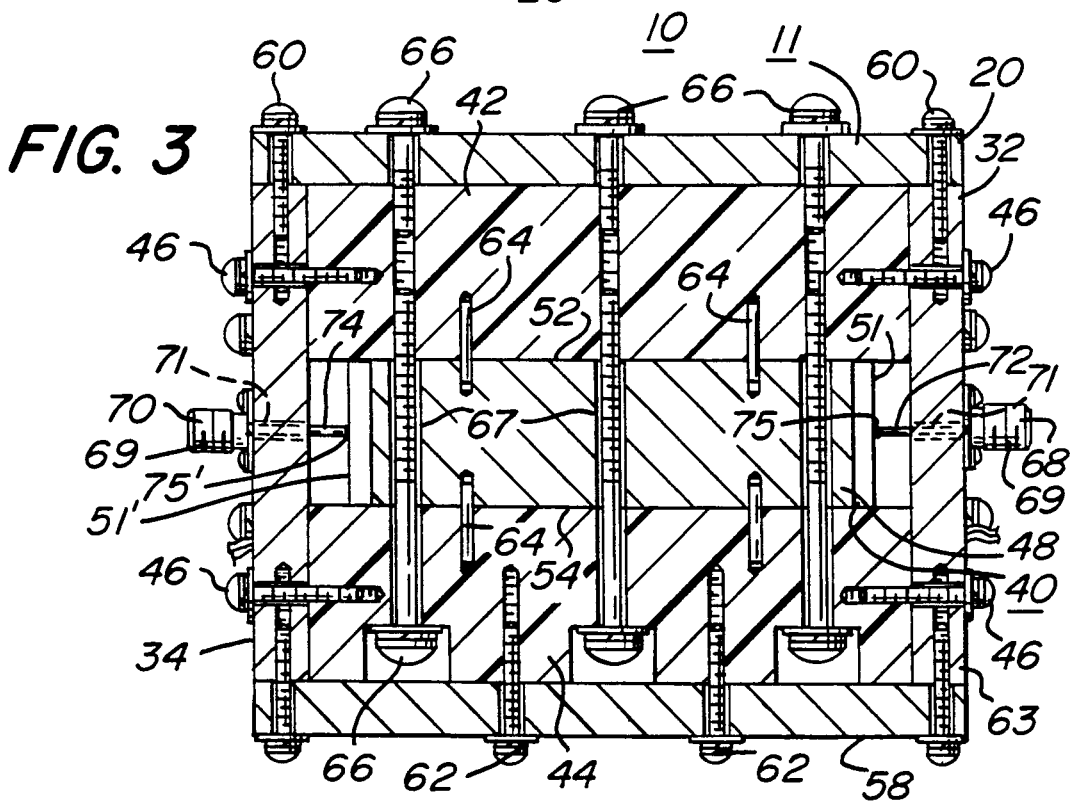
FIG. 3 is a sectional view taken on the line 3—3 of FIG. 2.
Figure 2:
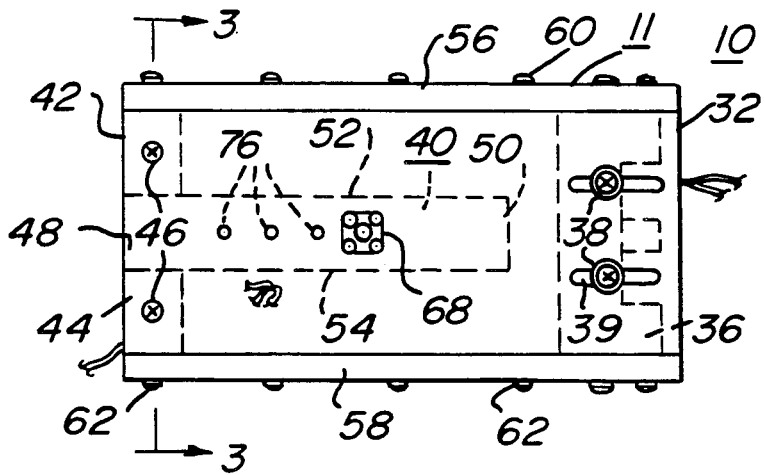
FIG. 2 is a front view of a switchable resonator device of the invention.

FIGS. 2 and 3 disclose a physical embodiment of the switchable resonator device 10 having an enclosure 11 with front and back plates 32 and 34 of electrically conducting material which may be silver plated to increase conductivity, a conductive right side member 36 secured between the front and back plates 32 and 34 by bolts 38 within slots 39 to allow adjustment of its position (see FIG. 2). An electrically conductive elongated rectangular metal plate providing a center block conductor 40 which may be silver coated to increase conductivity, is positioned in spaced relationship between the front and back plates 32 and 34 and the side member 36 (see FIG. 3) by a pair of upper and lower electrically insulating blocks 42 and 44. The blocks 42 and 44 are secured by screw means 46 with the front and back plates 32, 34, and securely retains between them the end 48 of the center block conductor 40 which has its other end 50 spaced from the right side member 36 (see FIG. 3). The block conductor 40 which is elongated in the direction between its ends 48 and 50 has side surfaces 51, 51' spaced from the front and back plates 32, 34 and upper and lower surfaces 52 and 54 which are also spaced from top and bottom conductive metal cover plates 56 and 58 which are secured by respective screw means 60 and 62 with the front and back plates 32 and 34 and the right side member 36. The block conductor 40 is one of the conductor elements of a shielded strip line conductor having its other conductor provided by the shielded enclosure 63 formed by the metal plates 32 and 34, right side member 36 and top and bottom cover plates 56 and 58 and considered to be at ground potential. As seen in FIG. 3, the end 48 of the block 40 which is reduced in width where it is secured between the insulating blocks 42 and 44, is further interengaged by pins 64. Compression force is also exerted on the end 48 between the blocks 42 and 44 by the bolts 66 which engage and extend between the insulating block 44 an the top cover plate 56 while passing through enlarged openings 67 in the block conductor 40 to provide insulation and prevent electrical contact therewith.

A miniature coaxial cable connector 68 is secured with the front plate 32 spaced intermediate the top and bottom cover plates 56, 58 for receiving input radio frequency signals, while a similar miniature coaxial cable connector 70 is secured with the back plate 34 at a location in line with and directly opposite to the connector 68 for providing output radio frequency signals. The outer conductors 69 of the connectors 68 and 70 are electrically connected to the conductive front and back plates 32 and 34 while their center conductors 72 and 74 extend through respective openings 71 in the plates 32 and 34 to engage opposite sides 51, 51' of the center block conductor 40 at directly opposite locations 75, 75' intermediate its ends 48 and 50. Connections are also made on opposite sides at locations 76 (see FIG. 2) of the center block conductor 40 displaced from the connections 75, 75' of the center conductors 72 and 74 of the connectors 68 and 70 as well as connections at the end 50 which will be explained in greater detail in connection with FIG. 4. The structure heretofore described in connection with FIGS. 2 and 3, thus provides a shielded strip line conductor having an insulated center block conductor 40 connected between signal input and output terminals, and an outer conductor provided by the enclosure 63 encompassing and electrically shielding the center block conductor 40.

Figure 4:
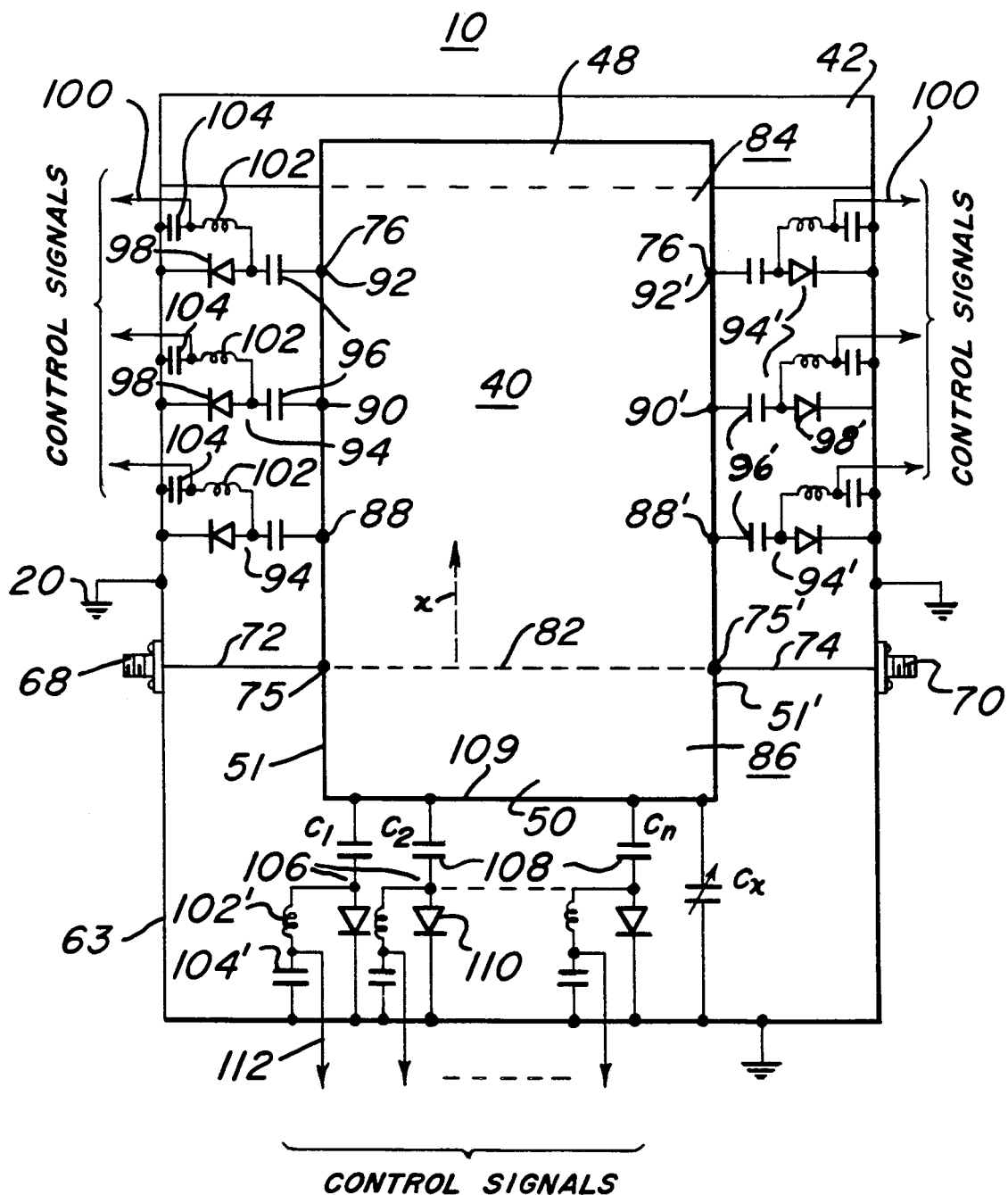
FIG. 4 is a diagrammatic drawing partially in schematic form illustrating the switchable resonator device of FIGS. 2 and 3.

FIG. 4 is a diagrammatic representation partially in schematic form showing the shielded enclosure 63 provided by the structure shown in FIGS. 2 and 3 and the center block conductor 40 positioned therein and electrically connected at 75, 75' to the center conductors 72 and 74 of the input and output signal connectors 68 and 70. The center conductors 72 and 74 are connected to the block conductor 40 at directly opposite locations 50 along a line 82 partitioning the block conductor 40 into a first larger portion 84 and a second smaller portion 86. Each of the portions 84 and 86 of the block conductor 40 extend transversely on each side of the line 82 and provide lumped inductive properties determined by their size, configuration, and other well known factors. In the operation of the present invention, the variable inductor 18 of FIG. 1 is provided by the portion 84 of the block 40 extending from the line 82 towards its end 48. The inductive properties are changed and controlled by changing the effective length "x" of the portion 84 as shown by the arrow in FIG. 4 extending from the partitioning line 82. For changing inductance, the length "x" is varied by electrically shorting or returning to ground the portion 84 at selected opposite points 76 along its extension as will now be described in detail.

At various opposite locations 76 such as at locations 88 and 88', 90 and 91', and 92 and 92', pairs of switching means 94 and 94' are connected for selectively electrically shorting or returning to ground 20 selected points by connection to the shielded enclosure 63. Each switching means 94, 94' includes a series connected combination of a bypass capacitor 96 and a semiconductor switching diode 98 connected between each of the plurality of locations 76 and the shielding enclosure 63. Control signals delivered are over respective lines 100 to the junction of capacitors 96, 96' and diodes 98, 98' of each switching means 94, 94' and controls the conductivity of the diodes 98, 98'. The control signals provide a bias signal to each of the diodes 98 which alternatively renders it either non conductive or conductive for effectively connecting its bypass capacitors 96, 96' to the ground potential in effect grounding the selected contact points 76 of the extending portion 84 of the block conductor 40 for controlling its inductance value. Since the radio frequency input signal is of high frequency, it is readily bypassed to ground by capacitors 96, 96' while the capacitors 96, 96' serve to block the dc biasing signals provided by the line 100. A radio frequency choke 102 is also provided in series with each control signal line 100 to attenuate radio frequency signals, while a blocking capacitor 104 which connects the signal lines 100 to ground also serves to bypass radio frequency signals.

A second plurality of switching means 106 are also provided for selectively connecting one or more of a plurality of tuning capacitors 108, such as capacitors $C_1$, $C_2$, ... $C_n$, between the end surface 109 of the extending portion 86 of the center block conductor 40 to ground potential provided by the shielding enclosure 63. For this purpose, each of the switching means 106 includes a tuning capacitor 108 in series with a semiconductor switching diode 110, bridging the end surface 109 and the enclosure 63. A plurality of signal control lines 112 are provided for delivering a biasing signal respectively to the junctions of each tuning capacitor 108 and diode 110 for rendering its diode 108 conductive or non conductive. The control signals for biasing the respective diodes 108 may be provided through a choke 102' and utilizing a blocking capacitor 104' as described in connection with the signal lines 100 for the same purpose. In this manner, by delivering selected biasing signals to the capacitors 108 and diodes 110, various values of selected capacitances can be provided in series with the lumped inductance of the extending portion 86 of the center block conductor 40 for providing the series inductance 22 and variable capacitance 24 as represented in FIG. 1, under control of control signals from the tuning control means 26.

In addition to the tuning capacitors 108, which are electronically controlled, an adjustable trimmer capacitor $C_x$ may be connected directly between the end surface 108 of the extending portion 86 of the center block conductor 40 and the shielding enclosure 63 for adjusting or calibrating purposes. The trimmer capacitor which is selected to have a low series resistance value for radio frequency signals by its connection in parallel with the switching means 106 assures a low resistance value for enhancing high performance characteristics for the circuit.

Figure 5:
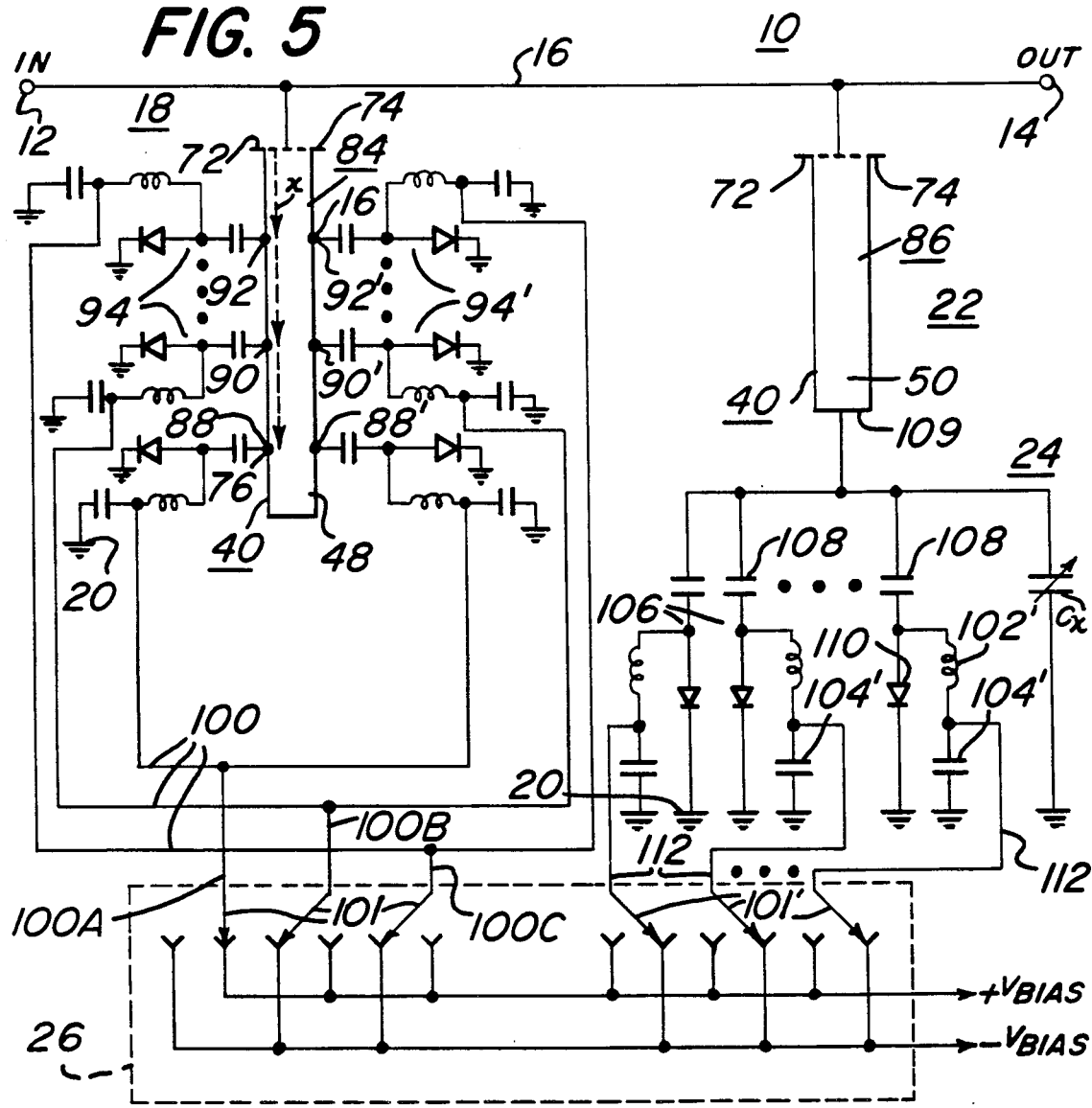
FIG. 5 is a detailed schematic drawing of the device of FIG. 4.

FIG. 5 is a schematic diagram corresponding to FIG. 1 and showing in greater detail the switching resonator device 10 as described in connection with FIG. 4. For this purpose, the elongated portion 84 of the center block conductor 40 connected with the center conductors 72, 74 of connectors 68, 70 providing the variable inductor 18 is shown separately from the elongated portion 86 providing the fixed inductor 22 which is returned to ground through variable capacitor 24 (FIG. 1). One end of the elongated portion 84 connected by the conductors 72, 74 is shown connected to the input and output terminals 12, 14, and the pairs of opposite locations 76 along its length towards its end 48 are respectively connected by the plurality of switching means 94, 94'. The effective length "x" of the portion 84 is controlled by the switching means 94, 94'. Only one set of opposite switching means 94, 94' at a time is rendered conductive by signals from the tuning control means 26. Thus, if the control means 26 delivers a conductive biasing signal to line 100A, such signal is delivered to oppositely positioned switching means 94, 94' connecting at locations 88, 88', electrically shorting the portion 84 at these locations to provide its longest extension or length "x." This provides the greatest value of lumped inductance for the variable inductor 18. When a conductive biasing signal is provided by the tuning control means 26 to the line 100B, switching means 94, 94' are rendered conductive for shorting the portion 84 at locations 90, 90' closer to its end contacted by the input and output conductors 72, 74, shortening its effective length "x." This provides a smaller value of a lumped inductance for the inductor 18. In the illustration provided, the delivery of a conductive biasing signal by the tuning control means 26 to the line 100C, renders conductive the pair of switching means 94, 94' engaging the portion 84 at locations 92, 92' closest to where the conductors 72, 74 engage the portion 84, providing the shortest length "x," and the lowest value of lumped inductance for the conductor 18. Of course, although only three pairs of switching means 94, 94', are illustrated in FIG. 5, a large number of pairs of switching means 94, 94' may be provided at various locations along the portion 84 determined by design circumstances for selecting various predetermined inductance values for the variable inductor 18. The semiconductor switching diodes utilized may be PIN diodes and energized by PIN diode drivers for providing efficient and high speed switching operations, and although delivery of bias signals to the various electrical lines 100 by the tuning control means 26 is shown in FIG. 5 by mechanical switch means 101, this is for illustrative purposes only, it being understood that such signals are delivered at a high rate to selected control lines 100 by electronic signal generating means which are well known.

The elongated body 86 providing the inductance of the fixed inductor 22 having one end connected to the center conductors 72, 74 of the connectors 68, 70 is also illustrated in FIG. 5 with its other end 50 connected to the plurality of switching means 106. The extending portion 86 of the block conductor 40 provides the lumped inductance of inductor 22 which is fixed, while the signals delivered by the tuning control means 26 over the control lines 112 select one or more of the tuning capacitors 108 for providing the variable capacitor 24 connected in series with the inductor 22 to ground 20. Although only several switching means 106 are shown, any number may be utilized as required by design circumstances for providing the combination of capacitors 108 for tuning the switchable resonator means 10 in desirable increments over wide band as selected by the control signals. The tuning control means 26, thus provides one or more signals over the lines 112 for selecting the desired combination of tuning capacitors 108 for changing its frequency from one value to another over the radio frequency range. Although the tuning control means 26 in FIG. 5 shows mechanical switches 101' for selecting the control lines 112 for appropriate biasing energization, it is understood this is also merely illustrative and that well known means are utilized for providing biasing signals at a high rate for achieving the desired operation. The diodes utilized by switching means 106 may also be of the PIN diode type and PIN diode drivers may be utilized for their energenization.

In operation, the tuning control means 26 provides signals to the control lines 100 for energizing a pair of switch means 94, 94' to render their diodes conductive, while at the same time energizing and rendering conductive a combination of switch means 106 for achieving the desired tuning operation for the switchable tuning device 10. Such control signals are concurrently provided to the switching means 94, 94', and 106 and sequentially altered as required for "hopping" from one frequency to another at a high rate, as may be required to achieve the desired operation. The particular structure of the device 10 disclosed allows accurate tuning of the center frequency of the device 10 over a wide frequency range, such as 100 to 500 MHz with a transitional time of not greater than 5 micro seconds. Such results are achieved by the particular configuration of the components providing the lumped inductors and by the switching means utilized in association therewith. This configuration of the switching resonator device 10 also allows a pair of switching means 94, 94' to be energized for varying the inductance of the inductor 18 for achieving coarse tuning of the device 10, while the capacitance of the variable capacitor 24 may be provided by a multiplicity of capacitors 108 as required, to permit the desired degree of fine tuning of the device 10 by providing a plurality of small increments. The structure also provides highly desirable band-pass filter characteristics for the device 10 which will now be described in greater detail in connection with the graphs of FIGS. 6, 7 and 9.

Figure 6:
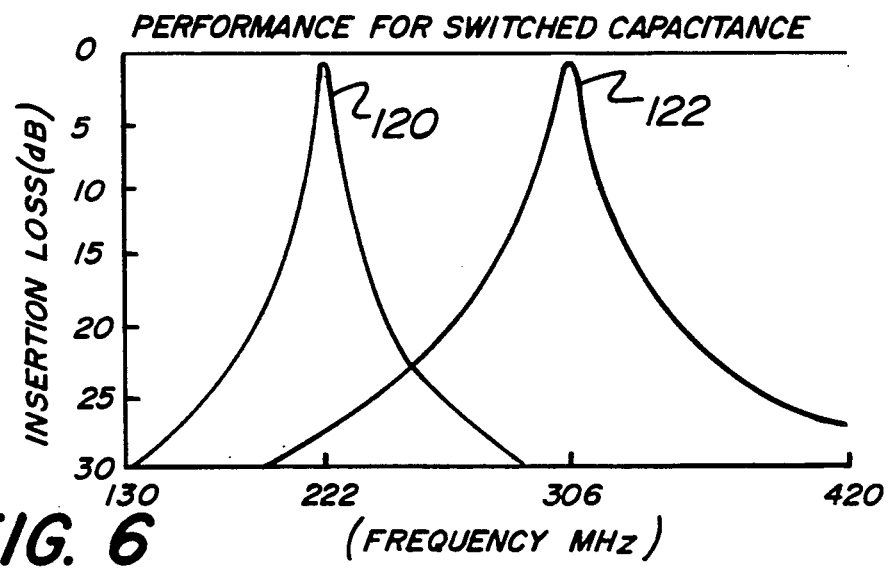
FIG. 6 is a graphic representation illustrating the band-pass characteristics of the switchable resonator device of FIGS. 2 and 3 over a frequency range of 130 to 420 MHz for several center frequencies provided by switching the variable tuning capacitors of its circuit.

FIG. 6 is a graph illustrating the insertion loss characteristics achieved by the tuning of the switchable resonator device 10 to several center frequencies. Thus, the curve 120 shows the device 10 tuned to a center frequency of 222 MHz with a small insertion loss of 0.8 db, and the second curve 122 shows a peak at the center frequency of 306 MHz with small insertion loss of 0.6 db. As shown, the insertion loss increases with frequency deviation from the center frequency, serving to selectively pass the signals over a narrow frequency pass-band about the center frequency, while attenuating other frequencies. The change in center frequency of the device 10 between the curves 120 and 122, was achieved by maintaining the variable inductor 18 at its maximum value, and varying the variable capacitor 24 between several of its values upon the delivery of appropriate control signals by the tuning control means 26.

FIG. 7 is a graphic representation similar to FIG. 6 of the band-pass characteristics of the switchable resonator device 10 providing band-pass curves 124, 126, 127, and 128 for insertion loss, with peaks at respective center frequencies of 223 MHz, 264 MHz, 285 MHz, and 310 MHz. The curves 124 and 126 provide a small insertion loss of 0.8 db, at their center frequencies, while the curves 127 and 128 at their center frequencies provide a small insertion loss of 0.6 db. These curves also illustrate the increase of insertion loss with deviation about their center frequencies, providing the desired pass-band characteristics for allowing passage through the device 10 of the desired radio frequency signals and effectively attenuating the non selected frequencies. The various center frequency characteristics illustrated in FIG. 7, were achieved by utilizing various combinations of control signals for enabling selected switching means 94, 94' and 106.

FIG. 8 illustrated in block form the connection of several single switchable resonator devices 10 and 10' in a cascade arrangement in which an input radio frequency signal is delivered to the input terminal 12' of the resonator device 10. The output signal of device 10 is delivered over a 50 ohm line to the input of the second single switchable resonator device 10'. The second device 10' delivers its output signal to the output terminal 14'. When the switchable resonator devices 10 and 10' are switched in synchronism to the same band-pass center frequencies, enhanced characteristics are achieved. This is illustrated in the graphic representation of FIG. 9 for several center frequencies.

FIG. 9 by its band-pass characteristic curves 130, 132 and 134 illustrates the enhanced characteristics of the cascaded devices 10 and 10' of the invention for center frequencies of 322 MHz, 363 MHz and 403 MHz. The curve 130 has an insertion loss of 1.2 db at its center frequency, while the curves 132 and 134 each provide the same insertion loss of 0.8 db at their respective center frequencies. It is noted that the curves of FIG. 9 show a rapid increase in insertion loss as the frequency deviates from its center frequency. This characteristic provides a higher degree of selectivity and narrower pass-band characteristic which is achieved by the cascading arrangement.

The switchable resonator device described is useful as a highly selective high power fast electronically tunable bandpass filter, also known as tracking filters and frequency hopping (agile) filter which may be required to suppress spurious radio emissions generated by high power frequency agile transmitters. Such filters are of special importance in the field of military communications where a plurality of collocated frequency "hopping" transmitters and receivers must operate simultaneously and in the same frequency band. The presence of such a filter between each radio and the antenna not only suppresses the unwanted out-of-band radio emissions but more importantly eliminates "adjacent channel interference" which is caused by adjacent radio transmitters operating simultaneously in the vicinity of the transmit/receive frequency. Using such a filter, therefore, provides a high degree of channel selectivity to both transmitters and receivers of tactical frequency hopping radio systems. The present invention which has narrow bandpass characteristic can be used with or without additional coupling to produce its filtering capability. The present switchable resonator device can also be used as a building block to form multi-resonator tunable bandpass filters by cascading or coupling a plurality of such resonators to achieve high degree of selectivity and increased out-of-band rejection.

It will, thus, of course, be understood that although a particular embodiment of the invention has been described in the specification and drawing contained herein for purposes of illustration, various modifications and changes may be made in the structures described without departing from the spirit of the invention.

What is claimed is:

1. A switchable resonator device having a selectable center frequency over a wide radio frequency range comprising a radio frequency signal input means and a radio frequency signal output means, a resonator structure connected between the signal input means and signal output means for receiving radio frequency input signals and delivering radio frequency output signals, the resonator structure comprising a radio frequency signal conductor having first and second conductor elements, the first conductor element having a first extending portion and a second extending portion with one portion extending from the other end and each providing respective inductance properties, first switchable means for controllably connecting the first portion of the first conductor element at a plurality of predetermined selected locations along its extension with the second conductor element for varying its inductive properties, and second switchable means for controllably providing a selected capacitance between the second portion of the first conductor element and the second conductor element, the control means providing control signals to the first and second switchable means to concurrently vary the inductive properties and capacitance for selecting and changing the center frequency of the resonator device.

2. A switchable resonator device having a selectable center frequency over a wide radio frequency range comprising a radio frequency signal input and output means each providing first and second conductors, a variable inductor connected between the first and second conductors of the signal input and output means, a fixed inductor series connected with a variable capacitor connected between the first and second conductors, and tuning control means providing control signals to the variable inductor and variable capacitor for concurrently varying and controlling respectively their inductor and capacitive properties and selecting and switching the center frequency of the resonator device over a wide radio frequency range.

3. A switchable resonator device of claim 2 in which the variable and fixed inductors are provided by a strip line conductor, and the strip line conductor has first and second conducting elements which are respectively connected with the first and second conductors of the input and output means.

4. A switchable resonator device of claim 3 in which the variable and fixed inductors are provided by first and second extending portions of the first conducting element of the strip line conductor with one portion extending from the other, the first and second portions having predetermined inductive properties, the first portion which provides the variable inductor including electrical shorting means connected along its extending portion or controllably being connected with and disconnected from the second conducting element at various locations for changing its inductive properties, and the variable capacitor comprises a plurality of parallel capacitors for being selectively electrically connected between the second extending portion of the first conductor element and the second conductor element, and the control signals of the tuning control means controllably electrically connect and disconnect selected ones of the parallel capacitors of the variable capacitor for selecting and switching the center frequency of the resonator device at a high rate over a wide radio frequency range.

5. The switchable resonator device of claim 4 in which the strip line conductor has opposite signal input and output ends, the input and output means respectively are coaxial input and output coaxial connectors respectively at opposite ends of the strip line conductor, the first conducting element of the strip line conductor is enclosed by the second conducting element, the input and output connectors each having a center conductor respectively electrically connected to opposite sides of the first conducting element along a line partitioning the first conducting element into the first and second portions with the portions being between and extending in a direction transverse to the first and second connectors.

6. The switchable resonator device of claim 5 in which the electrical shorting means comprises a plurality of pairs of shorting switches, the shorting switches of each pair of switches are oppositely connected at the various locations along the first conductor element of the strip line conductor, and the control signals of the tuning control means controllably electrically connect only one selected pair of shorting switches of the variable inductor at one time for selecting and switching the center frequency or the resonator device.

7. A switchable resonator device of claim 5 in which the second portion of the first conducting element has an end and each of the plurality of parallel capacitors comprises a control switch in series with a capacitor element selectively electrically connected between the end of the second portion of the first conducting element and the second conducting element of the strip line conductor, and the control signals of the tuning control means energizes the control switches for electrically connecting selected capacitors between the first and second conducting elements for selecting and switching the center frequency of the resonator device.

8. A switchable resonator device having a selectable center frequency over a wide range frequency range comprising a radio frequency signal input means and a radio frequency signal output means, a resonator structure connected between the signal input means and signal output means for receiving radio frequency input signals and delivering radio frequency output signals, the resonator structure comprising a radio frequency signal conductor having first and second conductor elements, the first conductor element having a first extending portion and a second extending portion with one portion extending from the other and each providing respective inductance properties, first switchable means for controllably connecting the first portion of the first conductor element at selected locations along its extension with the second conductor element for varying its inductive properties, and second switchable means for controllably providing a selected capacitance between the second portion of the first conductor element and the second conductor element, and control means providing control signals to the first and second switchable means for selecting and changing the center frequency of the resonator device, the radio frequency signal input and output means respectively comprising first and second coaxial cable input and output means each having a center conductor connected with the first conductor element of the resonator structure and an outer conductor connected with the second conductor element of the resonator structure, and the center conductors of the first and second cable means being connected to the first conductor element of the resonator structure at respective locations displaced from each other along a line defining a boundary between the first and second extending portions of the first conductor element of the resonator structure.

9. A switchable resonator device of claim 8 in which the resonator structure is a stripline conductor with the second conductor element encompassing the first conductor element, the first and second coaxial cable input and output means have their outer conductors secured with the second conductor of the resonator structure at locations opposite to each other, the first conductor element of the resonator structure is between the first and second coaxial cable input and output means with the center conductors of the coaxial cable means electrically engaging the first conductor element of the resonator structure at opposite locations along a line partitioning the first conductor element of the resonator structure to provide the first extending portion on the other side of the line and having the first and second portions extending in a direction which is transverse to that of the partitioning line.

10. The switchable resonator device of claim 9 in which the first conductor element of the resonator structure has a rectangular configuration providing first and second opposite ends at the first and second extending portions which are displaced from and oppositely positioned about the line partitioning the first conductor element of the resonator structure, and providing first and second opposite sides extending transversely to the ends and the partitioning line, the first switching means includes a plurality of pairs of shorting switches, with each switch pair controllably connecting one of a plurality of a selected locations on opposite sides of the first extending portion of the first conductor element of the resonator structure to the second conductor element, each of the selected locations being displaced a predetermined distance from the line partitioning the first conductor for selecting and changing the inductance properties of first extending portion, the control signal provided by the control means electrically selecting and enabling one of the plurality of pairs of oppositely positioned shorting switches for changing the inductive properties of the first extending portion of the first conductor element for selecting and changing the center frequency of the resonator device.

11. The switchable resonator device of claim 10 in which the second switching means includes a plurality of tuning capacitor elements for controllably being electrically connected between the second end of the second extending portion of the first conductor element and the second conductor element for providing a selected capacitance between the second extending portion of the first conductor element and the second conductor element of the resonator structure, the control means by its control signal electrically selecting and enabling one or more capacitor elements for selecting and changing the center frequency of the resonator device.

12. The switchable resonator device of claim 11 in which each of the plurality of shorting switches of the first switching means comprises a combination radio frequency bypass capacitor in series with a switch diode connected between the first extending portion of the first conductor element of the resonator structure and the second conductor element, and the control signal of the control means provides signals to the switch diodes of the pairs of shorting switches for selectively rendering the switch diodes of a selected one of the pairs of shorting switches conductive and electrically connecting the bypass capacitors at selected locations along the sides of the first extending element with the second element and rendering the remaining switch diodes non conductive for electrically disconnecting their bypass capacitors.

13. The switchable resonator device of claim 12 in which each of the tuning capacitor elements of the second switching means comprises a combination tuning capacitor in series with a control diode connected between the end of the second extending portion of the first conductor element of the resonant structure and the second conductor element, the control signal of the control means provides signals to the control diodes of the tuning capacitor elements for selectively rendering conductive the control diodes of selected tuning capacitor elements and electrically connecting its series connected tuning capacitor between the second portion of the first conductor element and the second conductor element of the resonant structure and rendering each of the remaining control diodes non conductive for electrically disconnecting its tuning capacitor and the control signal to the first switching means provides the coarse tuning of the center frequency while the control signal to the second switching means provides the fine tuning of the center frequency of the switchable resonator device.

14. The switchable resonator device of claim 13 in which the control signal of the control means provided to the first and second switching means periodically changes at a high rate to rapidly tune the switchable resonator device over a wide frequency range to selected sequential center frequencies, and the resonator structure rapidly changes its center frequency to correspond with the high rate of change of the control signal.

15. The switchable resonator device of claim 11 in which each of the tuning capacitor elements of the second switching means comprises a combination tuning capacitor in series with a control diode connected between the end of the second extending portion of the first conductor element of the resonant structure and the second conductor element, and the control signal of the control means provides signals to the control diodes of the tuning capacitor elements for selectively rendering conductive the control diodes of selected tuning capacitor elements and electrically connecting its series connected tuning capacitor between the second extending portion of the first conductor element and the second conductor element of the resonant structure and rendering each of the remaining control diodes non conductive for electrically disconnecting its tuning capacitor.

16. The switchable resonator device of claim 9 in which the first conductor element of the resonator structure has a rectangular configuration providing first and second opposite ends at the first and second extending portions which are displaced from and oppositely positioned about the line partitioning the first conductor element of the resonator structure, and providing first and second opposite sides extending transversely to the ends and the partitioning line, the second switching means includes a plurality of capacitor elements for controllably being electrically connected between the second end of the second extending portion of the first conductor element and the second conductor element for providing a selected capacitance between the second extending portion of the first conductor element and the second conductor element of the resonator structure, the control means by its control signal electrically selecting and enabling one or more of the capacitor elements for selecting and changing the center frequency of the resonator device.

17. A switchable resonator device having a selectable center frequency over a wide radio frequency range comprising a radio frequency signal input and output means each providing first and second conductors, a variable inductor connected between the first and second conductors of the signal input and output means, a fixed inductor series connected with a variable capacitor connected between the first and second conductors, and tuning control means providing control signals to the variable inductor and variable capacitor for varying and controlling respectively their inductive and capacitive properties and selecting and switching the center frequency of the resonator device over a wide range frequency range, the variable and fixed inductors being provided by a strip line conductor, and the strip line conductor having first and second conducting elements which are respectively connected with the first and second conductors of the input and output means, the variable and fixed inductors being provided by first and second extending portions of the first conducting element of the strip line conductor with one portion extending from the other, the first and second portions having predetermined extensions related to their respective predetermined inductive properties, the first portion which provides the variable inductor including electrical shorting means connected with and disconnected from the second conducting element at various locations for changing its inductive properties, and the variable capacitor comprising a plurality of parallel capacitors for being selectively electrically connected between the second extending portion of the first conductor element and the second conductor element, and the control signals of the tuning control means controllably electrically connecting and disconnecting selected ones of the parallel capacitors of the variable capacitor for selecting and switching the center frequency of the resonator device at a high rate over a wide radio frequency range, the strip line conductor has opposite signal input and output ends, and the input and output means are coaxial connectors at opposite ends of the strip line conductor, the first conducting element of the strip line conductor being enclosed by the second conducting element, the input and output connectors having a center conductor respectively electrically connected to opposite sides of the first conducting element along a line partitioning the first conducting element into the first and second portions with the portions being between and extending in a direction transverse to the first and second connectors, the electrical shorting means comprising a plurality of pairs of shorting switches, the shorting switches of each pair of switches being oppositely connected at the various locations along the first conductor element of the strip line conductor, and the control signals of the tuning control means controllably electrically connect only one selected pair of shorting switches of the variable inductor at one time for selecting and switching the center frequency of the resonator device, the electrical shorting switches of the variable inductor each include a switching diode in series with a radio frequency bypass capacitor, and each of the plurality of parallel capacitors of the variable capacitor comprises a switching diode in series with a capacitor element for selectively electrically connecting the capacitor element between the second portion of the first conductor and the second conductor of the strip line conductor, the control signals of the tuning control means rendering conductive and non conductive selected ones of the switching diodes of the variable inductor and variable capacitor for selecting and switching the center frequency of the resonator device, and the control signal of the control means changes at a high rate to rapidly tune the resonator device over a wide frequency range to selected sequential frequencies, and the resonator device rapidly changes its center frequency to correspond with the high rate of change of the control signal.

18. The switchable resonator device of claim 17 in which the variable capacitor further includes a trimmer capacitor having an adjustable capacitance electrically connected between the second extending portion of the first conductor element and the second conductor element in parallel with the capacitor elements and having a low resistance for enhancing the performance characteristics of the resonator device.

19. The switchable resonator device of claim 18 in which the tuning control means provides control signals to the pairs of shorting switches of the variable inductor for providing coarse tuning of the selected center frequency of the resonator device and concurrently provides control signals to the capacitors of the variable capacitor for providing fine tuning of the selected center frequency.

20. The device of claim 17 in which first and second switchable resonator devices are provided with each have signal input and output terminals, the first and second devices are connected in cascade arrangement in which an input signal is received at the input terminal of the first device and the output signal from the output terminal of the first device is delivered to the input terminal of the second device which delivers an output signal at its output terminal, and the tuning control means provide control signals to the first and second devices for tuning them concurrently to the same center frequencies for providing enhanced pass-band characteristics.

21. A switchable resonator device having a selectable center frequency over a wide radio frequency range comprising a radio frequency signal input and output means each providing first and second conductors, a variable inductor connected between the first and second conductors of the signal input and output means, a fixed inductor series connected with a variable capacitor connected between the first and second conductors, and tuning control means providing control signals to the variable inductor and variable capacitor for varying and controlling respectively their inductive and capacitive properties and selecting and switching the center frequency of the resonator device over a wide radio frequency range, the variable and fixed inductors being provided by a strip line conductor, and the strip line conductor having first and second conducting element which are respectively connected with the first and second conductors of the input and output means, the variable and fixed inductors being provided by first and second extending portions of the first conducting element of the strip line conductor with one portion extending from the other, the first and second portions having predetermined extensions related to their respective predetermined inductive properties, the first portion which provides the variable inductor including electrical shorting means connected along its extending portion for controllably being connected with and disconnected from the second conducting element at various locations for changing its inductive properties, and the variable capacitor comprising a plurality of parallel capacitors for being selectively electrically connected between the second extending portion of the first conductor element and the second conductor element, and the control signals of the tuning control means controllably electrically connecting and disconnecting selected ones of the parallel capacitors of the variable capacitor for selecting and switching the center frequency of the resonator device at a high rate over a wide radio frequency range, the strip line conductor has opposite signal input and output ends, and the input and output means are coaxial connectors at opposite ends of the strip line conductor, the first conducting element of the strip line conductor being enclosed by the second conducting element, the input and output connectors having a center conductor respectively electrically connected to opposite sides of the first conducting element along a line partitioning the first conducting element into the first and second portions with the portions being between and extending in a direction transverse to the first and second connectors, the first conductor element is an elongated center block conductor having opposite sides and first and second ends, the second conductor element of the strip line conductor comprises an electrically conductive enclosure receiving therein and electrically shielding the center block conductor comprising first and second spaced apart conductive front and back plates having first and second ends and top and bottom edges, a conductive side member secured with the front and back plates at their first ends, top and bottom cover plates secured with the front and back plates respectively at their top and bottom edges and with the side member, and a pair of upper and lower electrical insulator blocks secured with the front and back plates at their second ends and with the top and bottom cover plates, the insulator blocks being spaced from each other and having secured therebetween the first end of the center block conductor of the first conductor element with the center block conductor extending within the electrical enclosure in spaced relationship thereto, the connectors of the input and output means being mounted respectively on the front and back plates with each having its first conductor extending through its plate and connecting electrically to an opposite side of the center block conductor of the first conductor element of the strip line conductor and their second conductors connected respectively to the first and second plates.

22. A switchable resonator means comprising first and second switchable resonator devices each having a selectable center frequency over a wide radio frequency range comprising a radio frequency signal input means and a radio frequency signal output means, a resonator structure connected between the signal input means and signal output means for receiving radio frequency input signals and delivering radio frequency output signals, the resonator structure comprising a radio frequency signal conductor having first and second conductor elements, the first conductor element having a first extending portion and a second extending portion with one portion extending from the other and each providing respective inductance properties, first switchable means for controllably connecting the first portion of the first conductor element at selected locations along its extension with the second conductor element for varying its inductive properties, and second switchable means for controllably providing a selected capacitance between the second portion of the first conductor element and the second conductor element, and control means providing control signals to the fist and second switchable means for selecting and changing the center frequency of the resonator device, the signal input and output means of the first and second switchable resonator devices each having signal input and output terminals, the first and second devices being connected in cascade arrangement in which an input signal is received at the input terminal of the first device and the output signal from the output terminal of the first device is delivered to the input terminal of the second device which delivers an output signal at its output terminal, and the tuning control means provides control signals to the first and second devices for tuning them concurrently to the same center frequencies for providing enhances pass-band characteristics.

* * * * *